(12) United States Patent  
Davis

(10) Patent No.: US 8,559,183 B1  
(45) Date of Patent: Oct. 15, 2013

(54) METHOD TO USE EMPTY SLOTS IN ONBOARD AIRCRAFT SERVERS AND COMMUNICATION DEVICES TO INSTALL NON-PROPRIETARY SERVERS AND COMMUNICATIONS INTERFACES

(71) Applicant: iJet Technologies, Inc., Seattle, WA (US)

(72) Inventor: Terry L. Davis, Issaquah, WA (US)

(73) Assignee: iJet Technologies, Inc., Seattle, WA (US)

( * ) Notice: Subject to any disclaimer, the term of this patent is extended or adjusted under 35 U.S.C. 154(b) by 0 days.

(21) Appl. No.: 13/733,107

(22) Filed: Jan. 2, 2013

(51) Int. Cl.
*H05K 7/00* (2006.01)

(52) U.S. Cl.
USPC ...... 361/760; 361/679.48; 361/795; 361/729; 361/736; 361/826; 439/79; 439/378; 439/498; 439/544; 439/838; 439/660; 710/300; 710/302; 713/300; 714/25; 307/25

(58) Field of Classification Search
USPC ............ 361/760, 679.48, 795, 729, 730, 736, 361/896, 826; 439/79, 378, 498, 544, 638, 439/660; 710/300, 302; 713/300, 796; 714/25; 29/942; 307/25
See application file for complete search history.

(56) References Cited

U.S. PATENT DOCUMENTS

| | | | | |
|---|---|---|---|---|
| 4,899,254 A | * | 2/1990 | Ferchau et al. | 361/695 |
| 4,967,311 A | * | 10/1990 | Ferchau et al. | 361/736 |
| 5,515,515 A | * | 5/1996 | Kennedy et al. | 710/302 |
| 5,549,480 A | * | 8/1996 | Cheng | 439/79 |
| 5,659,680 A | * | 8/1997 | Cunningham et al. | 714/25 |
| 5,909,584 A | * | 6/1999 | Tavallaei et al. | 713/300 |
| 6,377,471 B1 | * | 4/2002 | Chong et al. | 361/796 |
| 6,507,882 B1 | * | 1/2003 | Golka et al. | 710/302 |
| 6,592,401 B1 | * | 7/2003 | Gardner et al. | 439/544 |
| 6,997,736 B2 | * | 2/2006 | Costello et al. | 439/378 |
| 7,256,992 B1 | * | 8/2007 | Stewart et al. | 361/679.48 |
| 7,393,248 B2 | * | 7/2008 | Best et al. | 439/638 |
| 7,673,186 B2 | * | 3/2010 | Hillman | 714/44 |
| 8,345,428 B2 | * | 1/2013 | Nielsen et al. | 361/729 |
| 2003/0046467 A1 | * | 3/2003 | Golka et al. | 710/300 |
| 2003/0140190 A1 | * | 7/2003 | Mahony et al. | 710/302 |
| 2005/0122701 A1 | * | 6/2005 | Coffey | 361/796 |
| 2005/0215107 A1 | * | 9/2005 | Castello et al. | 439/378 |
| 2006/0185876 A1 | * | 8/2006 | Aviv | 174/50 |
| 2007/0041340 A1 | * | 2/2007 | Binder | 370/264 |
| 2007/0139296 A1 | * | 6/2007 | Ho | 345/1.1 |
| 2007/0279892 A1 | * | 12/2007 | Della Fiora et al. | 361/826 |
| 2008/0048665 A1 | * | 2/2008 | Burkland et al. | 324/500 |
| 2008/0122289 A1 | * | 5/2008 | Best et al. | 307/25 |
| 2008/0126814 A1 | * | 5/2008 | Burkland et al. | 713/300 |

(Continued)

*Primary Examiner* — Xiaoliang Chen

(74) *Attorney, Agent, or Firm* — Lee & Hayes, PLLC

(57) ABSTRACT

The power supply and cooling provided by existing aircraft system line replaceable units (LRUs) or other devices supports new cards that are installed in previously empty slots or which replace existing original cards and which are not limited in functionality and do not require licensing of any proprietary technology included in the LRU. These new cards can include components such as processors, memory, and/or storage that significantly improve the performance of the LRU, and/or add new functionality—all without exceeding the power supply and cooling capability of the LRU. A network and avionics bus interface can be added to a portion of the new card and electrically coupled to the circuitry and electronic components on the new card, so that one or more cables connected to the interface can be connected to externally accessible standard avionics buses and network connectors added to a chassis of the LRU.

11 Claims, 9 Drawing Sheets

(56) References Cited

U.S. PATENT DOCUMENTS

| | | | |
|---|---|---|---|
| 2008/0287005 A1* | 11/2008 | Kameda | 439/498 |
| 2009/0284934 A1* | 11/2009 | Nielsen et al. | 361/730 |
| 2010/0120266 A1* | 5/2010 | Rimborg | 439/65 |
| 2010/0159750 A1* | 6/2010 | Lee et al. | 439/660 |

* cited by examiner

METHOD TO USE EMPTY SLOTS IN ONBOARD AIRCRAFT SERVERS AND COMMUNICATION DEVICES TO INSTALL NON-PROPRIETARY SERVERS AND COMMUNICATIONS INTERFACES

BACKGROUND

Traditional aircraft components have been built as single function units that include all of the elements of a specific system. Each such component can be removed as an integral unit for maintenance and replaced with a spare while the maintenance is being done. For this reason, these components are often called "line replaceable units" (LRUs).

Further, vendors design these LRUs to be completely proprietary, since each LRU is intended to only accept cards designed and provided by the vendor that produced it. The backplanes in LRUs contain custom traces or leads that carry vendor proprietary unit and electronic card controls and communications for which the interface specifications are often not publicly available and can only be purchased or licensed from the vendor.

In all such units, the backplane includes leads or traces that carry power to individual slots in the LRU, such that when a card is plugged into the backplane, it obtains power from it. These devices are designed to provide adequate power and cooling to all available card slots, regardless of whether all of the card slots are actually populated with cards.

The design of these systems is often completed years before they are installed in an aircraft, and they are intended to remain untouched or unmodified for additional years. However, as the development of computer processors, memory, storage, and related electronic component technologies continues to progress over time, the available processing power increases, memory capacity increases, and the physical size of storage decreases. In addition, the power consumption and heat generation of these new and more powerful components tends to decrease based on improvements in IC technology. Thus, computers become smaller, faster, more capable, cooler, and require less power to operate. However, the older design of LRUs cannot readily be updated to take advantage of such improved components.

A further complicating factor for the aircraft system vendors is that components that were used in an older design for processing and memory storage cards may no longer be commercially available several years after an LRU was originally installed, when the aircraft owner might want to add one or more other cards to the unit. Because of the proprietary nature of the LRU, it may not be possible for a third party to provide a card that can simply be added to the LRU. The only current solution is to have the system vendor that provided the LRU, design proprietary new cards at a considerable expense to the airline. Often, the design of the overall system or unit precludes the support or addition of desirable common features, like network, wireless, remote monitoring and diagnosis, etc.

In addition, adding a new card with new electronic components or system functions to an existing avionics unit requires the entire system to be re-certified by the FAA for use on an aircraft, since any new electronic components or functions may generate new interactions with the existing cards through their common connections on the backplane of the avionics unit.

Accordingly, it would be desirable to provide an alternative approach for adding cards with additional desired functionality to existing LRUs or for replacing original cards with new cards that use improved components and which operate faster or more efficiently than the original cards—without the need to obtain a new card from the original vendor of the LRU and without the need to purchase a license from the vendor to enable a third party to provide the new card, or to obtain FAA re-certification of the existing cards and unit functionality. It would further be desirable to use the existing power and cooling provided by an LRU for improved replacement cards or new cards added to empty slots in the LRU, where the new cards provide new or improved functionality and do not require a proprietary license to build and operate. Such an alternative approach should enable an aircraft owner to use existing systems on their aircraft that have unused slots to add new non-proprietary functionality or to upgrade existing cards, and to provide support for new system functions or features with enhanced processing power, memory, storage, networks, and other benefits.

SUMMARY

In consideration of the foregoing, an exemplary method is provided for energizing and cooling a circuit card that is coupled to a backplane in an avionics device, while preventing signals other than electrical power from being conveyed between the circuit card and a slot in the backplane to which the circuit card is coupled. The method eliminates electrical contact between conductors in the slot and a circuit on the circuit card, except specific conductors in the slot that provide electrical power required to energize the circuit card, and the circuit card is electrically coupled to the specific conductors in the slot. Cooling provided in the avionics device is employed to cool the circuit card. Since the backplane cannot be used for this purpose, one or more other signals are conveyed between the circuit card and an external bus, device or network using an alternative approach.

In one application, the circuit card provides additional functionality to the avionics device that was not provided in the avionics device when it was manufactured. In this application, the circuit card is coupled to an empty slot in the backplane that was not previously in use for any other circuit card.

In another application, the circuit card is a replacement for an original circuit card previously installed in the avionics device and provides at least one of greater speed of operation, improved efficiency, or lower power consumption, compared to the original circuit card. For this application, the circuit card is coupled to the slot where the original circuit card was installed after the original circuit card has been removed from the slot.

To eliminate electrical contact between the conductors in the slot and the circuit on the circuit card, except specific conductors in the slot that provide electrical power required by the circuit card, only conductive traces are provided on a footer area of the circuit card that is inserted into the slot. These conductive traces on the footer area are disposed where the specific conductors in the slot that carry electrical power signals are located, so that the conductive traces on the footer area contact the specific conductors in the slot. Electrical power is thus supplied to energize the circuit card, but no other signals on other conductors in the slot are electrically coupled to the circuit card.

In another exemplary approach for eliminating electrical contact between the conductors in the slot and the circuit on the circuit card, except specific conductors in the slot that provide electrical power required by the circuit card, an extender is provided between the circuit card and the slot. The circuit card is inserted into the extender, and the extender is inserted into the slot of the avionics device backplane. Further, the portion of the extender that is inserted into the slot only includes conductive traces needed to contact the specific conductors in the slot, to provide the electrical power required to energize the circuit card.

Yet another exemplary approach for eliminating electrical contact between the conductors in the slot and the circuit on the circuit card, except specific conductors in the slot that provide electrical power required by the circuit card is accomplished by creating an electrically open condition in electrical traces on a backplane bus that provide any signal other than electrical power to the slot in which the circuit card is inserted. Accordingly, only the specific conductors in the slot are active.

At least one externally accessible connector can be added to the avionics device, and signals can then be conveyed between the circuit card and the external bus, device, or network by connecting one or more cables between a bus interface provided on the circuit card and the at least one externally accessible connector. The one or more signals can thereby be conveyed between the circuit card and any external bus, device, or network that is connected to the externally accessible connector.

Alternatively, one or more cables can be connected to a bus interface provided on the circuit card and can then extend outside the avionics device to the external bus, device, or network. Signals are then conveyed over the one or more cables between the circuit card and the external bus, device, or network.

Cooling provided in the avionics device can be used for the circuit card. For example, one or more motor-driven fans or some other cooling mechanism that is included in the avionics device can provide cooling for both the device and the circuit card.

A network and avionics bus interface that is electrically coupled to a circuit on the circuit card can be disposed on either a surface of the circuit card, proximate to a top of the circuit card, or proximate to an end of the circuit card. The avionics bus interface enables signals to be transferred between the circuit on the circuit card and the external bus, device, or network.

This Summary has been provided to introduce a few concepts in a simplified form that are further described in detail below in the Description. However, this Summary is not intended to identify key or essential features of the claimed subject matter, nor is it intended to be used as an aid in determining the scope of the claimed subject matter.

DRAWINGS

Various aspects and attendant advantages of one or more exemplary embodiments and modifications thereto will become more readily appreciated as the same becomes better understood by reference to the following detailed description, when taken in conjunction with the accompanying drawings, wherein.

Figure 6:
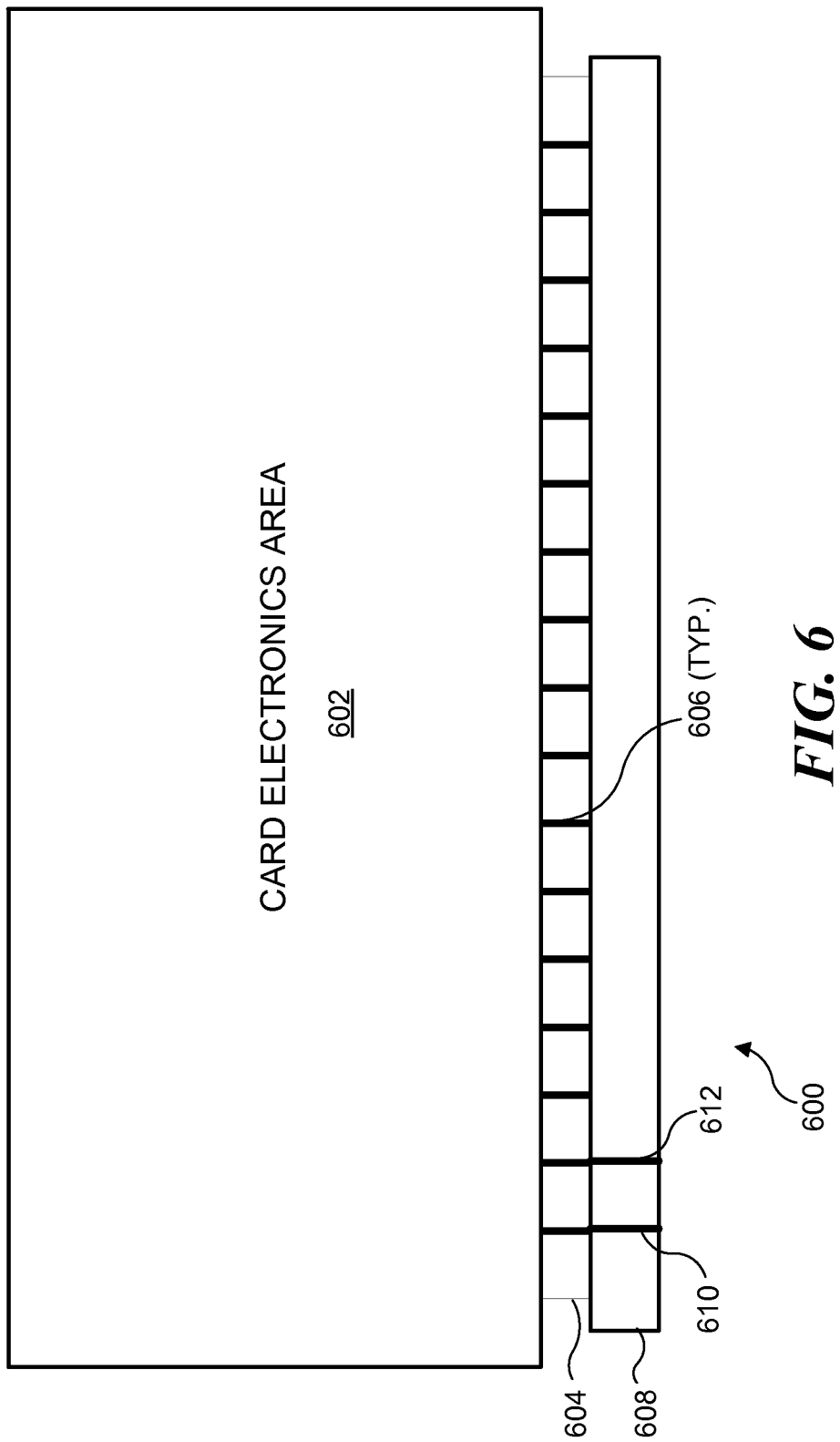
Figure 7:
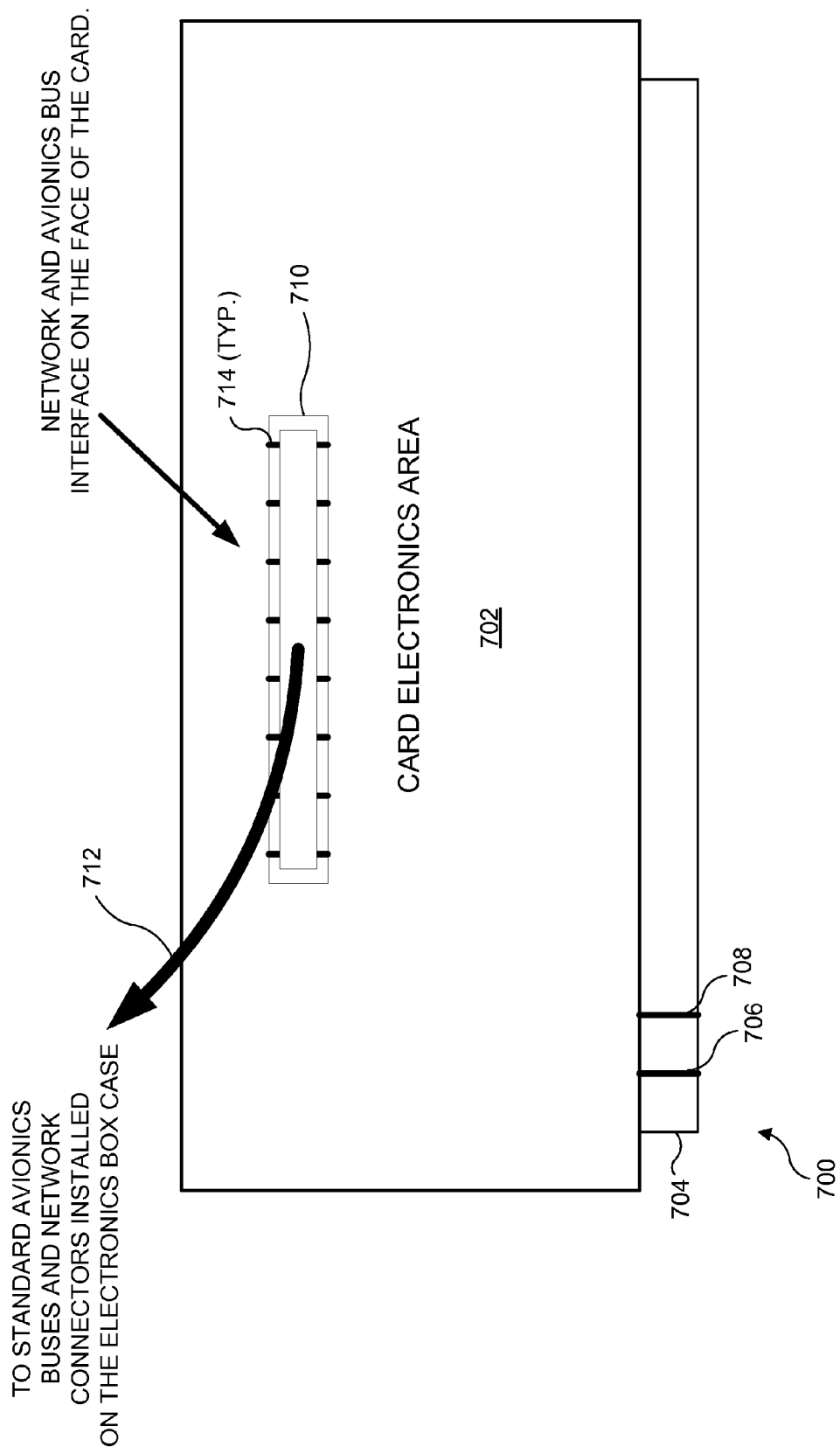
Figure 8:
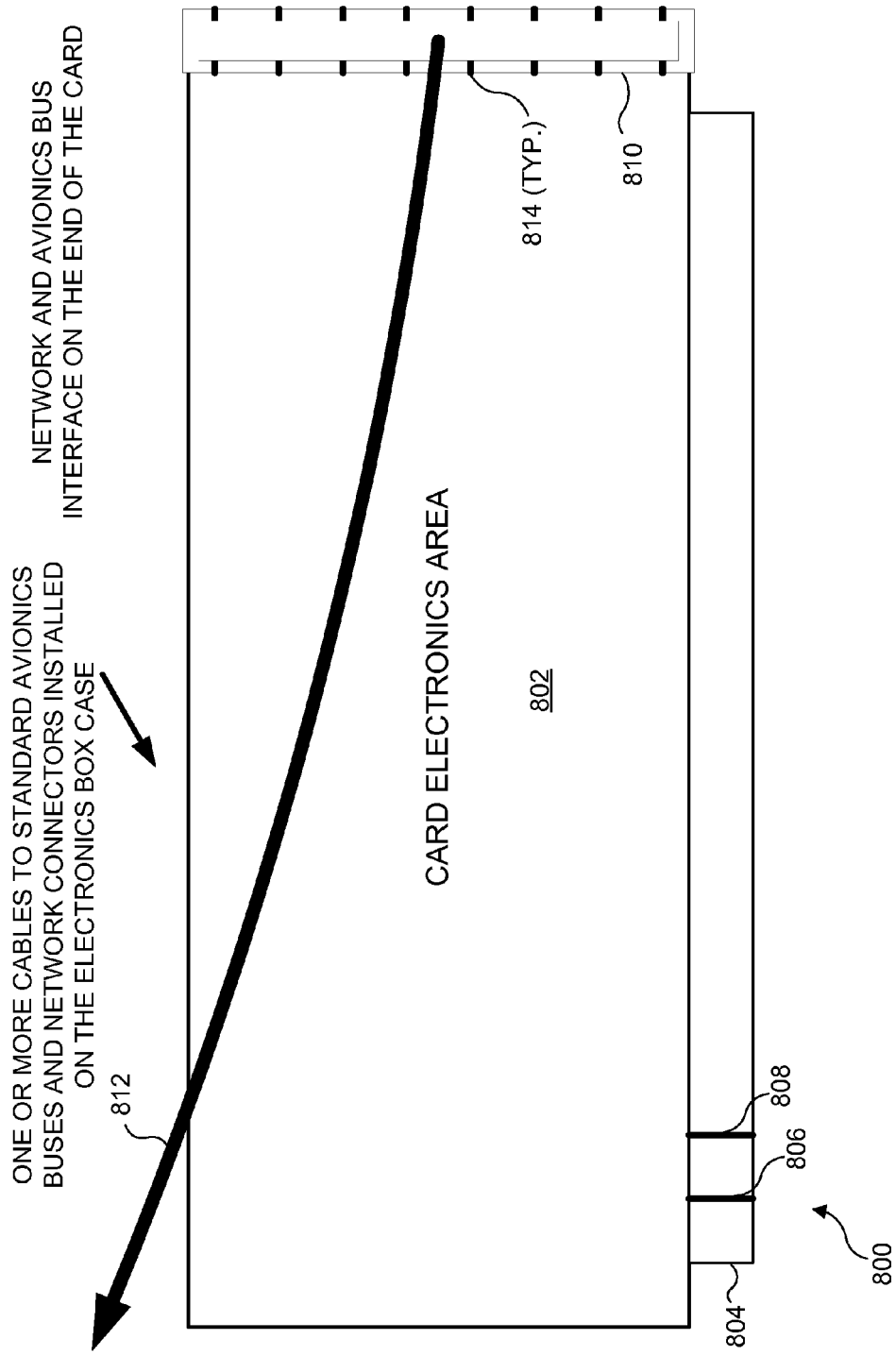
Figure 9:
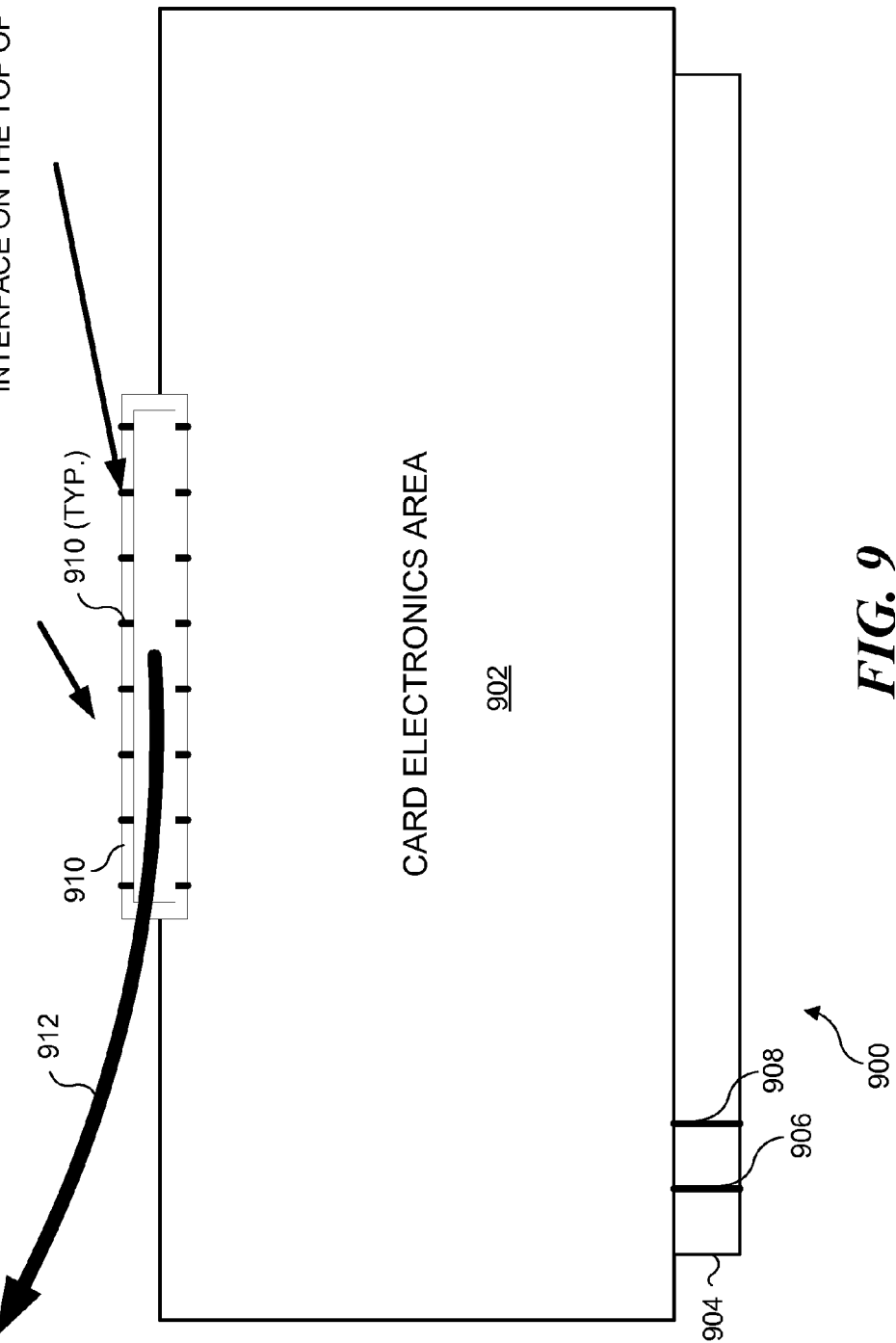

FIG. 6 is an elevational simplified schematic view of another exemplary embodiment of a new card that includes a plurality of traces on its footer area, but which is inserted into a shim or extender that interfaces with an empty slot of the backplane, wherein the shim or extender only includes power traces to interface with the conductive traces in the slot of the backplane bus, so that the new card is isolated from all but the power lines in the backplane;

FIG. 7 is an elevational simplified schematic view illustrating another exemplary embodiment of a new card that is provided with a network and avionics bus interface on a face of the new card but only power traces on its footer area that is inserted into the slot of a backplane bus in an LRU or other device;

FIG. 8 is an elevational simplified schematic view illustrating yet another exemplary embodiment of a new card that is provided with a network and avionics bus interface on an end of the new card, but power traces are provided on its footer area that is inserted into the slot of a backplane bus in an LRU or other device; and FIG. 9 is an elevational simplified schematic view illustrating still another exemplary embodiment of a new card, where the new card is provided with a network and avionics bus interface on a top portion of the new card, but only power traces are provided on the footer area of the new card that is inserted into the slot of the backplane bus of an LRU or other device.

DESCRIPTION

Figures and Disclosed Embodiments are not Limiting

Exemplary embodiments are illustrated in referenced Figures of the drawings. It is intended that the embodiments and Figures disclosed herein are to be considered illustrative rather than restrictive. No limitation on the scope of the technology that follows is to be imputed to the examples shown in the drawings and discussed herein.

Overview

Figure 1:
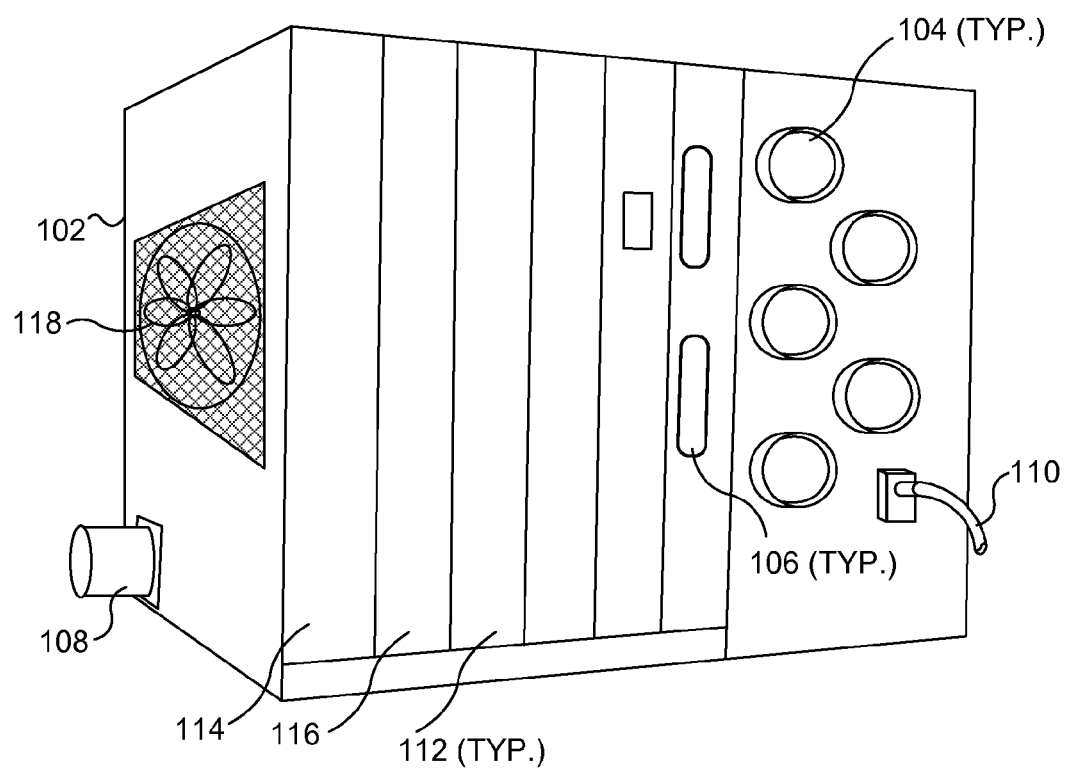
FIG. 1 is a perspective elevational view of a front and left side of an exemplary avionics LRU that includes two empty or unused slots on its internal backplane.

The following describes several exemplary approaches that enable an original card in an aircraft server, communication device, or other type of LRU 100, such as illustrated in FIG. 1, to be replaced with a different card that more efficiently performs at least the same functionality as the original card, and/or an empty slot of the backplane in the LRU to be filled with a new card that adds new or additional functionality. To simplify the following discussion, both an improved card provided for replacing an original card, and a new card that is inserted in a previously empty slot of the backplane are referred to herein as simply a "new card." It will further be understood that the term "new card" refers to a circuit board having an electronic circuit formed thereon, and that the electronic circuit is electrically coupled to electronic components mounted on the circuit board.

The new card can provide new functionality, greater speed of operation, improved efficiency, lower power consumption, and other benefits. To avoid any need for accessing proprietary technology related to the device into which it is being inserted or the need to obtain a license from the original vendor of the LRU or other device, the new card is inserted into a slot on the backplane of the LRU in a manner so that the new card does not electrically connect to any lines or traces in the slot other than those providing electrical power required to energize the new card. The new card can be configured so that it is not coupled to the original vendor's backplane card control and communication lines, enabling new cards to readily be used in the slots of a device backplane, so long as the new cards do not exceed the power capacity of the original device design and do not generate sufficient heat to exceed the original design's rated cooling capacity for the device. Additionally, new cable, network, and/or system status and control wiring from the new card may be included as external connections disposed either proximate to the end, top, or side (surface) of the new card, as required, enabling connections to standard avionics buses and network connectors through new cabling connected to the new card and to new connectors installed on the chassis of the device in which the new card is inserted, or the cabling may extend outside the chassis and connect externally to standard connectors on other devices, or to external network or system connections.

This approach thus avoids the limitations of proprietary card control signaling and communications on systems having empty card slots for use, enabling an aircraft owner to employ the previously unused slots to add new functionality, capabilities, or services to their aircraft, but without incurring the costs of installing entirely new systems or units. For example, both the Boeing 787 Corenet LRU and the Airbus 380 Network Server System typically have empty slots on their backplane, and in most configurations, these empty slots can be used to add the new cards using the approach described herein. In both of these devices, an added benefit is that the technique of avoiding the control signaling for the slot in which a new card is inserted also completely isolates the new card from flight critical communication and controls, and enables the new card vendor to easily obtain the necessary "Supplemental Type Conditions" (STCs) from the FAA or EASA, since the new card has NO capability to interfere with the functions of these existing LRUs. This isolation of the new card from the other functionality of the LRU in which it is inserted ensures that the empty slots in such LRUs can be used without impacting the aircraft certification or special conditions pertaining to the LRU.

As shown in the example illustrated in FIG. 1, LRU 100 includes a chassis 102 having a plurality of external multi-pin connection ports 104, additional multi-pin connection terminals 106, and a side Ethernet port 108. Other ports and connectors may be provided on an LRU for conveying a variety of communication and data signals to and from external devices that are coupled to the LRU. One or more cables 110 may also be coupled to the chassis of the LRU for this purpose. In addition, exemplary LRU 100 includes a plurality of slots 112 in which original design cards are installed. In this example, LRU 100 includes empty slots 114 and 116 in which no cards are presently installed. Thus, a new card might be installed in either or both of empty slots 114 and 116, using one of the exemplary approaches described below to insure that the new card is connected to only receive electrical power, but no other signals from the backplane (not shown) of LRU 100, and to benefit from the cooling within chassis 102, which may be provided by one or more motor-driven fans 118 or other cooling mechanism (not shown). While motor-driven fan 118 is shown at a side of LRU 100 in this example, it will be understood that the motor-driven fan may instead be disposed at the other side, the rear, the front, the bottom, or the top of the LRU, and that more than one motor-driven fan 118 can be provided and the multiple motor-driven fans located more at more than one of these surfaces of the LRU. Other types of cooling, such as circulating cooled fluid, or Peltier (thermoelectric) cooling can alternatively be included in LRU 100 or can be added to cool the new card(s) that are disposed within chassis 102 of the LRU, if the heat load of the new cards exceeds the unit's existing rating.

As explained below, means for preventing signals (other than power) from being conveyed between a new card and an LRU backplane can include one of the following approaches:
1. Modification of the backplane to remove all connections except those carrying electrical power to each empty slot that may be filled with a new card;
2. Manufacture of a new backplane with only power presented to the empty slots;
3. Manufacture of a new card without contacts on a footer area (i.e., a portion of the new card that is inserted into a slot of the backplane) to anything but power; or
4. Use of an extender or shim insert between the new card and the backplane, which has traces that convey only electrical power to the new card from the backplane slot when the new card is inserted into the extender or shim and the extender or shim is then inserted into a slot of the backplane bus.

DETAILED INVENTION DESCRIPTION

Figure 2:
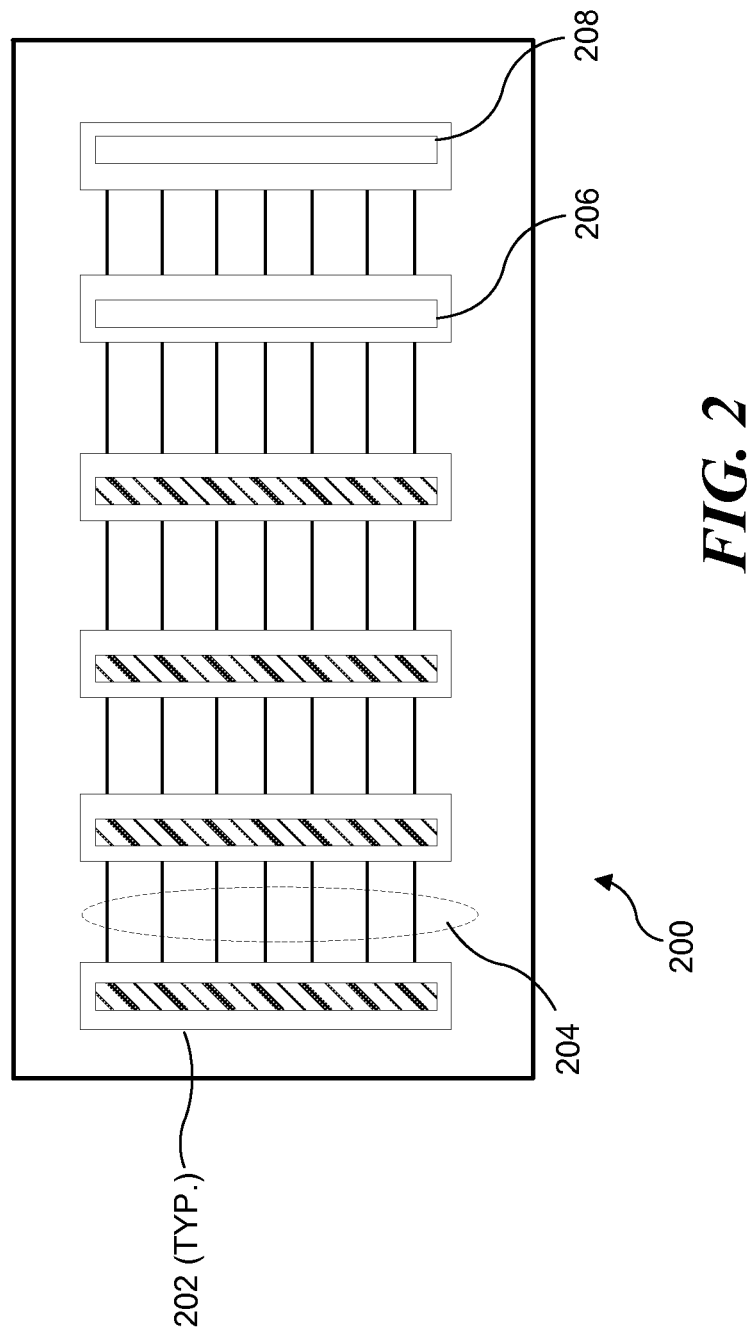
FIG. 2 is a schematic plan view of an exemplary backplane in an LRU backplane illustrating the two empty slots.

The following describes more details of several exemplary approaches for using empty slots in onboard aircraft servers and communications devices to install non-proprietary servers and communications interfaces and thereby provide additional services, capabilities, or functions to the aircraft. FIG. 2 illustrates an exemplary backplane 200 that might be included in an LRU, such as exemplary LRU 100, which is shown in FIG. 1. Backplane 200 can include a plurality of populated slots 202 in each of which an original design card is inserted to connect electrically to a plurality of traces 204 that extend along the backplane, coupling with the connections in each slot. It should be noted that a backplane can include any number of traces 204—from just a few to hundreds of traces. In exemplary backplane 200, there are also two unused or empty slots 206 and 208, both of which are coupled to traces 204, just as populated slots 202. As noted above, a number of problems discourage third party vendors from seeking a license to the proprietary technology used in the backplane so as to provide new cards that can either replace one of the original design cards in populated slots 202, or be inserted into one or both of unused slots 206 and/or 208.

The present approach avoids the problems noted above by using only the existing power supply and cooling already provided in an LRU for the new cards, but not receiving any other signal from or providing any other signals to the LRU, thereby ensuring complete electronic signal isolation from the existing cards in the LRU via the backplane bus. The LRUs are designed for the case in which the LRU is fully populated with processing and/or communications cards, so adding new cards to the empty slots on a backplane does not exceed the capacity of the power supply or overtax the cooling capacity of the chassis of the LRU.

In onboard systems that are not fully populated and have empty card slots, this approach enables the use of new cards of the same or different card type, but which are not limited in functionality or provide greater efficiency or other benefits, do not require proprietary licensing to build and operate or affect the certification of the existing cards or their connected system, and which interface with the original backplane of the unit only for obtaining electrical power needed to energize the new cards. The use of the empty card slots in existing LRUs, such as onboard servers or communications systems, to power and cool new cards not provided by the original vendor of the LRU is unique in the avionics industry, since no other approach has been developed to achieve this capability.

The present approach can facilitate the use of new cards in existing LRUs by ensuring that the new cards do not have any connection to any of the bus traces or other internal interfaces provided by the unit vendor—other than those providing electrical power. Accordingly, the new card cannot present or receive signals to or from the LRU backplane. This approach enables a standard vendor's card to be utilized in a slot, or a partially modified version of a standard card to be employed in the slot, or a completely new card design to be installed and used—either as a new card replacing an original design card, or as a new card that is inserted in an empty slot. In addition, this approach provides completely new external interfaces to the new card by installing new terminals or connectors on the unit chassis or enabling cables to be coupled to the new card and to external connectors, so that signals provided to or produced by new card can be conveyed externally to facilitate the functionality and capabilities of the new card(s) being used in a device.

Figure 3:
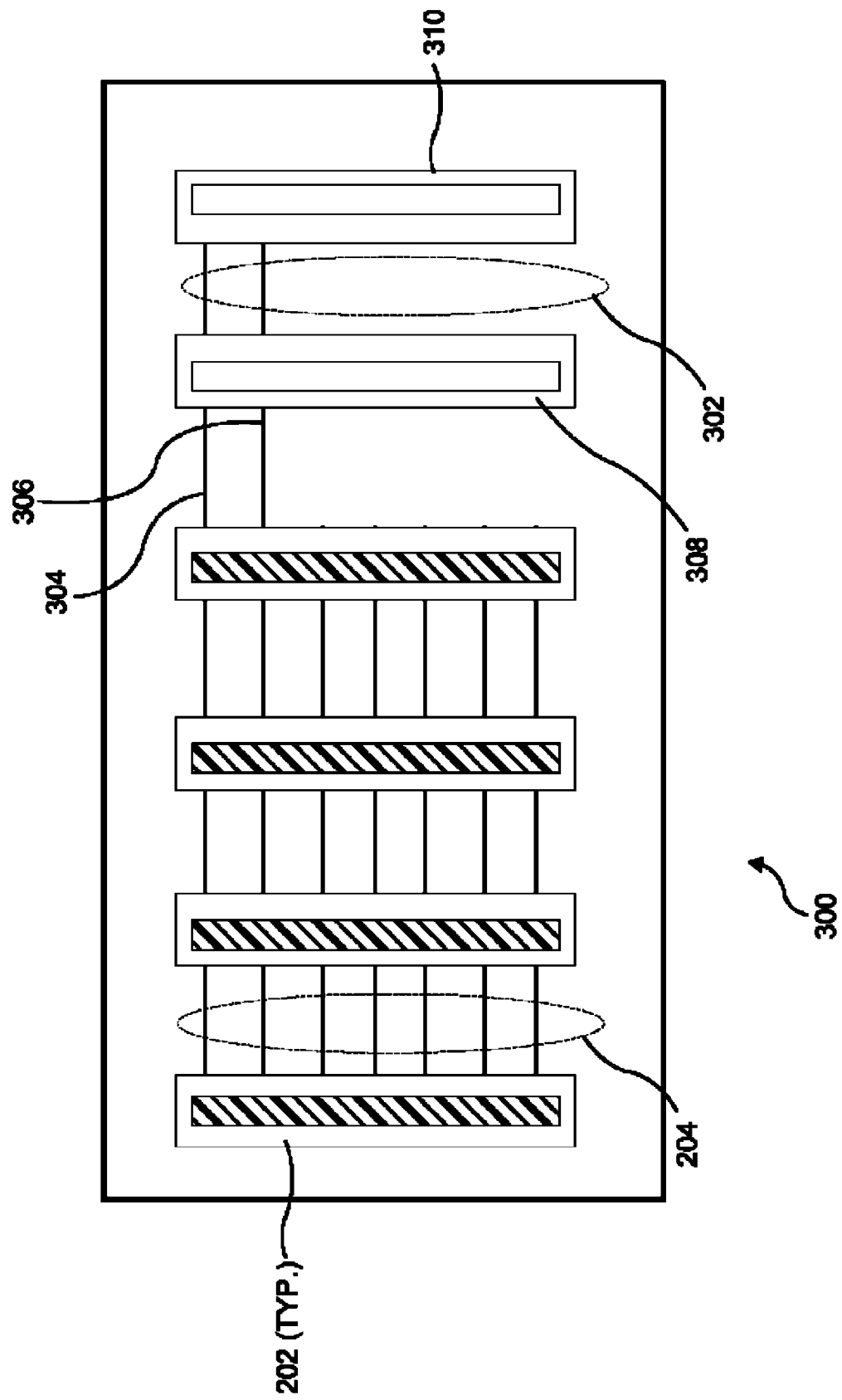
FIG. 3 is a schematic plan view of a first exemplary embodiment of a modified backplane of an LRU in which all but the electrical power traces or lines of the backplane coupled to two empty slots have been removed (open-circuited), preventing any new card that is inserted into either of the two empty slots from coupling to any signals on the backplane other than the electrical power.

One exemplary embodiment shown for a backplane 300 that is illustrated in FIG. 3 provides for altering a portion 302 of backplane bus 204, so that only power traces 304 and 306 are provided to unused or empty slots 308 and 310; all other traces or conducting lines on the backplane bus for these unused slots are either cut, removed, or otherwise disabled. An original backplane bus can be modified, or a new backplane bus can be fabricated that does not include traces or conducting lines to the unused slots except those that supply electrical power required by a new card that may be inserted in the unused slot. All other traces or conducting lines in backplane bus 204 except those providing electrical power to the unused slot are thus in an open condition, and only the conductors in the slot that provide electrical power are active. Additionally, the new isolated section of the backplane can include unique traces that only connect new cards to the backplane so as to provide them bus connectivity and functionality that is isolated from the original bus segment.

It will be apparent that a new card can then be inserted into either (or both) of unused slots 308 and 310, and the new card will be unable to receive any signals from backplane 204 or provide signals to it, and will be isolated from the cards in previously populated slots 202. It should be noted that for simplicity, only two traces 304 and 306 are illustrated in this and in regard to other exemplary embodiments discussed herein, although it will be understood that there may be a ground trace, and one or more power traces, each of which may convey a different voltage. For example, a new board may require one or more different voltages such as any of: +5 VDC, -5 VDC, +12 VDC, -12 VDC, +24 VDC, and -24 VDC (by way of example, and without any implied limitation), but traces conveying other voltages (either AC or DC) might be employed by a new card. If so, all power traces providing the voltages required by the new card would be retained for energizing the components on the new card, so that there might be more than two electrical power traces connected from the backplane to the new card.

Figure 4:
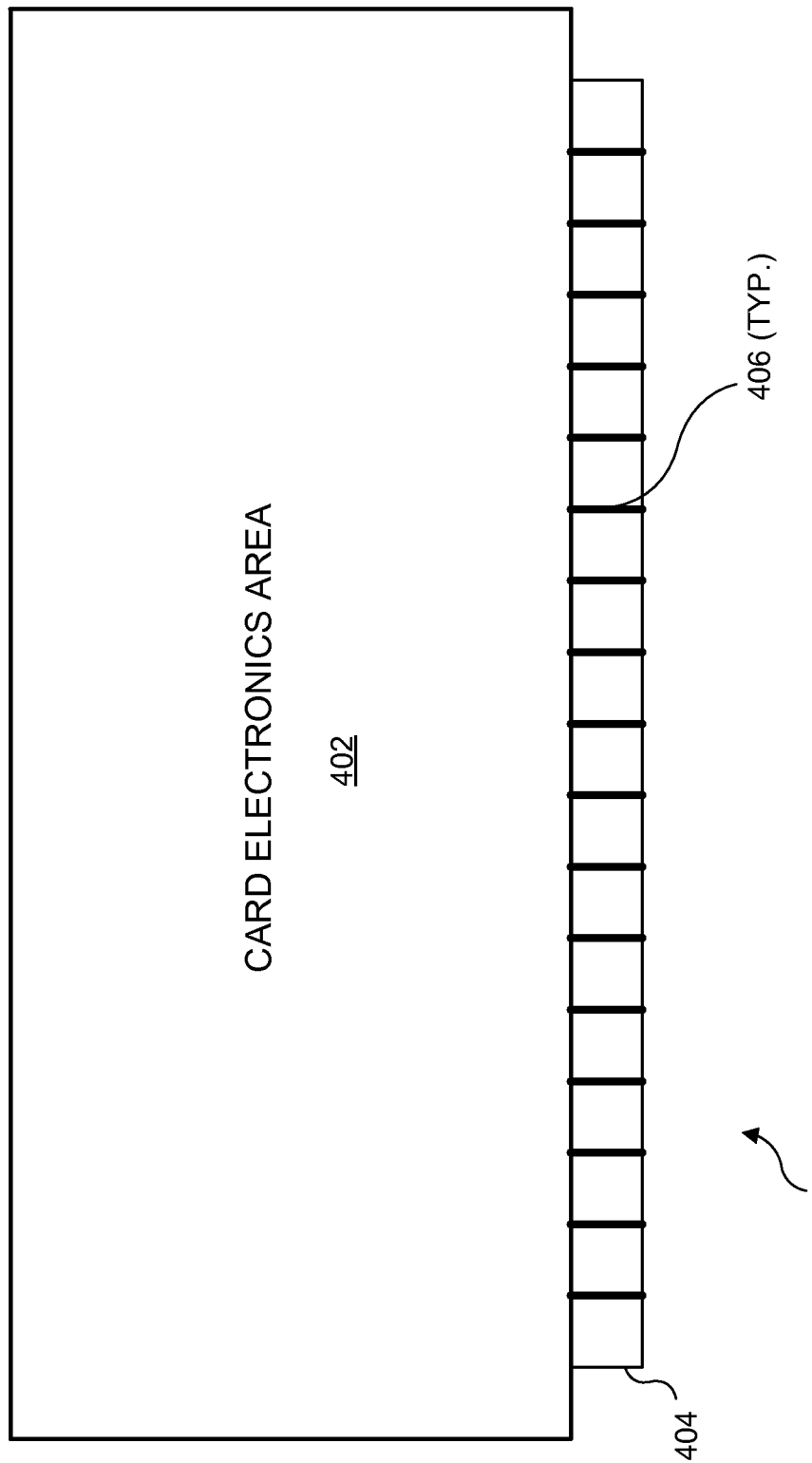
FIG. 4 is an elevational simplified schematic view illustrating an example of an original card that might be inserted into a slot of a backplane in an LRU, so as to connect to a plurality of traces in the backplane, not limited to just those providing electrical power.

FIG. 4 illustrates an exemplary original card 400 that might commonly be installed in the slots of a backplane. Card 400 includes an electronics area 402 where various electronic components are installed and are coupled with an appropriate circuit provided in the card electronics area. The electronic circuit may be photolithographically formed as copper traces, at one or more levels and/or on one or both sides of the card. The card circuitry is coupled to a footer area 404 on the bottom of the card (in the example, but not limited to the bottom, since original cards in an LRU or other device can couple to a backplane of a different design, for example, using a region on an end of the card, or on the top of the card). In this example, footer area 404 includes a plurality of electrically conductive traces 406 that are spaced apart at positions corresponding to the locations of conductive contacts in the slot into which card 400 would be inserted to implement design functions in a device such as an LRU. It will be understood that fewer or more electrically conductive traces 406 can be provided on a card and that they be disposed on one or both sides of footer area 404 and may be spaced closer or further apart, as required to mate with the corresponding electrically conductive contacts within the slot into which the card will be inserted on a backplane.

Figure 5:
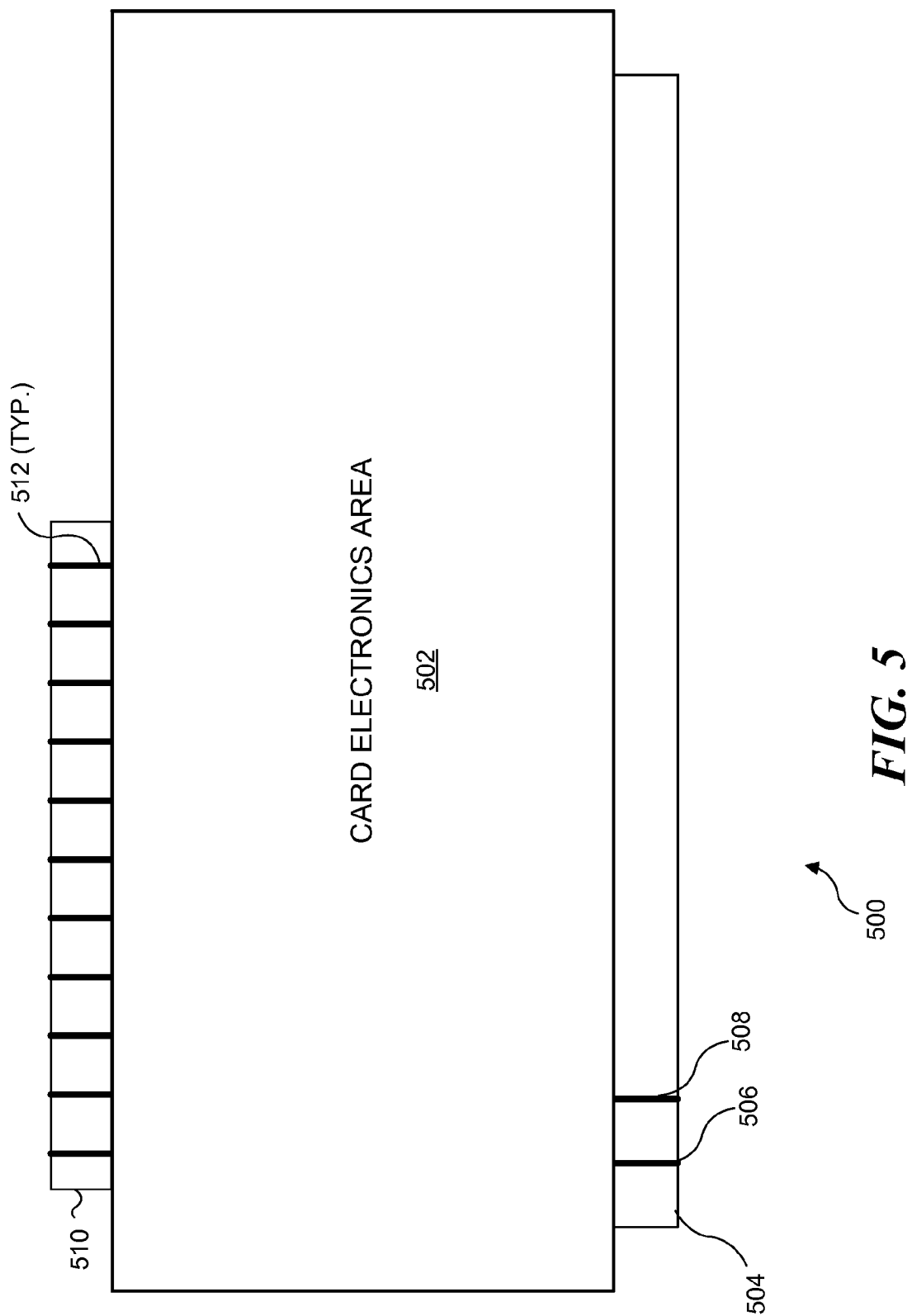
FIG. 5 is an elevational simplified schematic view illustrating an exemplary embodiment of a new card that can be inserted into an empty slot of an unmodified backplane of an LRU, a footer area of the new card only includes traces disposed to couple to electrical power lines in the backplane, but not any other traces that may connect to other signals of the backplane.

FIG. 5 illustrates an exemplary embodiment of a new card 500 that uses a different approach for isolating the new card from all but the traces of a backplane that convey electrical power required by the new card. Like card 400, which is illustrated in FIG. 4, new card 500 includes a card electronics area 502 where a plurality of electronic components are mounted and interconnected with an appropriate electronic circuitry, e.g., copper traces that are photolithographically or otherwise formed on the new card. However, a footer area 504 of new card 500 only includes electrical power traces 506 and 508 (representing all electrical power traces required by the new card) for coupling to corresponding electrical contacts in a slot into which new card 500 is installed. No traces are provided on footer area 504 for coupling to contacts in the slot that convey any other signals to or from the new card. Instead, new card 500 includes a top area 510 on which are formed a plurality of conductive traces 512 that are positioned to couple with a plurality of conductors inside an appropriate slotted female connector (not shown) that can be attached to the new card. The slotted female connector can thus be coupled to the top area of new card 500, and one or more cables from the slotted female connector (not shown) can be connected to standard avionics buses and network connector(s) that are added to the chassis of the LRU or other device in which new card 500 is installed. Although not shown, a slotted female connector can be provided in the top area of the new card, so that a male connector can couple to it. Alternatively, the one or more cables from the slotted female connector (or male connector) can pass through an opening in the chassis to couple to external equipment or connectors. New card 500 can thus be inserted into an empty slot or into a slot previously occupied by an original design card. The new card can provide added functionality and/or efficiency by being added to an LRU in the empty slot or by replacing an older and less efficient or less capable original card. While new card 500 includes a new top area for connecting to one or more appropriate external ports or cables, it will be apparent that connection to the circuitry of the new card that is provided in electronics area 502 can instead be accomplished by using a network and avionics bus interface included on the top, surface, or end of the new card, as discussed below.

As illustrated in FIG. 6, a further exemplary embodiment of a new card 600 is shown inserted into a slot of an extender 608 that is disposed between the slot of the backplane (not shown) and a footer area 604 of the new card. Footer area 604 includes a plurality of traces 606, but only the traces conveying electrical power to new card 602 will be used. Specifically, only electrical power signals from the backplane slot into which extender 608 is inserted are coupled through traces 610 and 612 on the extender to corresponding power traces included among traces 606 on footer area 604 of new card 600. Electronic conductors formed, e.g., photolithographically or in some other manner, on new card 600 within a card electronics area 602 interconnect a plurality of electronic components that are installed within the card electronics area. Signals produced by or input to these electronic components may be electrically coupled to traces 606 formed on the new card footer area 604, but will not be conveyed through extender 608 to traces in the slot provided in the backplane of the LRU or other device in which the new card is used. Instead, means for conveying signals between the new card and an external bus, device or network are provided and include one of the alternative embodiments discussed below in which a network and avionics bus interface on card electronics area 602 of the new card is used in connection with conveying signals between new card 600 and the external bus, device or network.

Examples of Network and Avionics Bus Interfaces for Use on New Cards

FIG. 7 illustrates an exemplary embodiment of a new card 700 that has a card electronics area 702 (generally as described above in regard to other exemplary embodiments of a new card), except that the card electronics area also includes a network and avionics bus interface 710. In this example, new card 700 includes a footer area 704 with only the traces required for supplying electrical power to the new card, such as traces 706 and 708, disposed and spaced apart to connect with electrical power conductors within the slot of a backplane into which the new card is inserted. Signals are conveyed to and from electronic components of a circuit formed in card electronics area 702 through one or more cables or conductors 712 that are connected to conductors 714 provided at spaced-apart intervals within network and avionics bus interface 710. The one or more cables 712 are in turn connected to one or more externally accessible standard avionics buses and network connectors that have been added to the chassis of the LRU or other device in which the new card is being used, or may instead, simply pass through one or more orifices and couple to standard avionics buses and network connectors provided on external equipment.

Another alternative approach for adding an external network and avionics bus is illustrated in regard to a new card 800, which is shown in FIG. 8. New card 800 includes a footer area 804 on which is provided only with the traces needed to provide the required electrical power to energize the new card, such as traces 806 and 808, which couple to corresponding electrical conductors in the slot of a backplane bus. No other traces are included on the footer area for conveying signals between the new card and other conductors in the slot. Electronic circuitry and components in a card electronics area 802 are connected to a network and avionics bus 810 that is mounted at an end of new card 800 and which includes a plurality of spaced-apart electrical conductors 814 to couple to corresponding conductors on one or more connectors (not shown) provided on one or more cables 712. The one or more cables can be connected to externally accessible standard avionics buses and network connectors that are added to the chassis of the LRU or device, to interface with external avionics buses and network connectors, or the cables can simply pass through orifices in the chassis to couple to appropriate connectors on external devices.

Finally, in FIG. 9, still another approach is shown on an exemplary new card 900 for coupling signals between the new card and external equipment. New card 900 includes only traces on its footer area 904 that are required for supplying the new card with electrical power, such as traces 906 and 908, which connect to corresponding conductors in a slot of a backplane. But, new card 900 is not connected to any other conductors included in the slot. Electrical circuitry and components in a card electronics area of new card 900 are connected to a network and avionics bus interface 910, which is mounted near the top edge of new card 900. Again, in a manner similar to the other approaches discussed above, signals between the new card and external devices are conveyed through one or more cables 912 that are terminated in one or more connectors (not shown), which are coupled to network and avionics bus interface 910. The one or more cables can be connected to externally accessible standard avionics bus and network connectors that have been added to the chassis of the LRU or other device in which new card 900 is installed, so that external connectors and cables can be coupled thereto, or alternatively, one or more cables 912 can be extended through the chassis to connect to external connectors or other devices.

It is also acknowledged that either dip switches or card software commands executed by processing or logic circuits on a new card could be used to disable the use of any traces on the backplane connecting to the new card; however, both of these approaches require additional levels of testing and certification to adequately prove the connection to other bus functionality and signals is disabled and cannot be accidentally or maliciously re-enabled. Use of either of these alternative approaches is likely to cause the FAA to deny certification and thus use of such a new card in an aircraft LRU or other device.

Although the concepts disclosed herein have been described in connection with the preferred form of practicing them and modifications thereto, those of ordinary skill in the art will understand that many other modifications can be made thereto within the scope of the claims that follow. Accordingly, it is not intended that the scope of these concepts in any way be limited by the above description, but instead be determined entirely by reference to the claims that follow.

The invention claimed is:

1. A method for energizing and cooling a circuit card coupled to a backplane in an avionics device used in an aircraft, while preventing signals other than electrical power from being conveyed between the circuit card and a slot in the backplane that is electrically coupled to the circuit card, comprising:
    (a) eliminating electrical contact between conductors in the slot and a circuit on the circuit card, except specific conductors in the slot that provide electrical power required to energize the circuit card, wherein the conductors are spaced-apart longitudinally within the slot, and the slot extends longitudinally in alignment with a footer area of the circuit card on which electrical traces are disposed;
    (b) coupling the electrical traces on the footer area of the circuit card to the specific conductors in the slot;
    (c) employing cooling provided in the avionics device to cool the circuit card; and
    (d) conveying one or more signals between the circuit card and an external bus, device, system, or network, without using the backplane of the avionics device.

2. The method of claim 1, wherein the circuit card provides additional functionality to the avionics device itself, or to other systems on the aircraft, or new functionality to the aircraft that were not provided in the avionics device when it was manufactured, wherein coupling the circuit card to the slot in the backplane comprises coupling the circuit card to an empty slot in the backplane that was not previously in use for any other circuit card.

3. The method of claim 1, wherein the circuit card is a replacement for an original circuit card previously installed in the avionics device and provides at least one of greater speed of operation, improved efficiency, or lower power consumption, compared to the original circuit card, and wherein coupling the circuit card to the slot in the backplane comprises coupling the circuit card in the slot of the original circuit card after the original circuit card has been removed from said slot.

4. The method of claim 1, wherein eliminating electrical contact between the conductors in the slot and the circuit on the circuit card, except specific conductors in the slot that provide electrical power required by the circuit card comprises including only conductive traces on the footer area of the circuit card that is inserted into the slot where the specific conductors in the slot that carry electrical power signals are disposed, so that the conductive traces on the footer area contact the specific conductors in the slot, and electrical power is thus supplied to energize the circuit card, but no other signals on other conductors in the slot are electrically coupled to the circuit card, ensuring that the circuit card cannot affect existing aircraft certifications or base FAA or EASA certifications for the avionics device.

5. The method of claim 1, wherein eliminating electrical contact between the conductors in the slot and the circuit on the circuit card, except specific conductors in the slot that provide electrical power required by the circuit card comprises providing an extender between the circuit card and the slot, wherein the circuit card is inserted into the extender, and the extender is inserted into the slot, the extender including only conductive traces needed to contact the specific conductors in the slot, to provide the electrical power required to energize the circuit card.

6. The method of claim 1, wherein eliminating electrical contact between the conductors in the slot and the circuit on the circuit card, except specific conductors in the slot that provide electrical power required by the circuit card comprises creating an electrically open condition in electrical traces on a backplane bus that provide any signal other than electrical power to the slot in which the circuit card is inserted, so that only the specific conductors in the slot are active.

7. The method of claim 1, further comprising adding at least one externally accessible connector to the avionics device, wherein conveying signals between the circuit card and the external bus, device, or network comprises connecting one or more cables between a bus interface provided on the circuit card and the at least one externally accessible connector, so that the one or more signals are conveyed through the one or more cables to the at least one externally accessible connector, enabling the one or more signals to be conveyed between the circuit card and any external bus, device, or network that is connected to the externally accessible connector.

8. The method of claim 1, wherein conveying signals between the circuit card and the external bus, device, or network comprises connecting one or more cables to a bus interface provided on the circuit card and extending the one or more cables from the bus interface outside the avionics device to the external bus, device, or network, so that signals are conveyed over the one or more cables between the circuit card and the external bus, device, or network.

9. The method of claim 1, wherein employing cooling provided in the avionics device comprises using one or more motor-driven fans or other cooling mechanism that is included in the avionics device to provide cooling for the avionics device and for the circuit card.

10. The method of claim 9, adding additional or alternative cooling to the avionics device to provide cooling for the circuit card if a heat load produced by the circuit card exceeds a rated heat load of the avionics device as originally designed.

11. The method of claim 1, further comprising providing a network and avionics bus interface that is electrically coupled to a circuit on the circuit card, so that the network and avionics bus interface is disposed on either a surface of the circuit card, or proximate to a top of the circuit card, or proximate to an end of the circuit card, the avionics bus interface enabling signals to be transferred between the circuit on the circuit card and the external bus, device, system, or network.

\* \* \* \* \*